United States Patent
Yoo et al.

(10) Patent No.: US 6,815,007 B1
(45) Date of Patent: Nov. 9, 2004

(54) METHOD TO SOLVE IMD-FSG PARTICLE AND INCREASE CP YIELD BY USING A NEW TOUGHER UFUN SEASON FILM

(75) Inventors: Ming-Hwa Yoo, Ilan (TW); Shih-Chi Lin, Taipei (TW); Yi-Lung Cheng, Taipei (TW); Szu-An Wu, Hsin-Chu (TW); Ying-Lang Wang, Tai-chung County (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 208 days.

(21) Appl. No.: 10/086,258

(22) Filed: Mar. 4, 2002

(51) Int. Cl.$^7$ ................................................ C23C 16/22
(52) U.S. Cl. .......................... 427/255.7; 427/255.393; 427/255.394; 427/255.37; 438/783
(58) Field of Search ..................... 427/255.7, 255.393, 427/255.394, 255.37, 579; 438/783

(56) References Cited

U.S. PATENT DOCUMENTS

| | | |
|---|---|---|
| 4,363,828 A | 12/1982 | Brodsky et al. |
| 4,495,218 A | 1/1985 | Azuma et al. |
| 4,585,671 A | 4/1986 | Kitagawa et al. |
| 4,684,542 A | 8/1987 | Jasinski et al. |
| 5,227,329 A | 7/1993 | Kobayashi et al. |
| 5,607,724 A | 3/1997 | Beinglass et al. |
| 5,614,257 A | 3/1997 | Beinglass et al. |
| 5,648,293 A | 7/1997 | Hayama et al. |
| 5,656,531 A | 8/1997 | Thakur et al. |
| 5,695,819 A | 12/1997 | Beinglass et al. |
| 5,700,520 A | 12/1997 | Beinglass et al. |
| 5,705,080 A | 1/1998 | Leung et al. |
| 5,786,027 A | 7/1998 | Rolfson |
| 5,789,030 A | 8/1998 | Rolfson |
| 5,811,356 A | 9/1998 | Murugesh et al. |
| 5,837,580 A | 11/1998 | Thakur et al. |
| 5,874,129 A | 2/1999 | Beinglass et al. |
| 5,876,797 A | 3/1999 | Beinglass et al. |
| 5,885,869 A | 3/1999 | Turner et al. |
| 5,983,906 A | 11/1999 | Zhao et al. |
| 6,020,035 A | 2/2000 | Gupta et al. |
| 6,027,705 A | 2/2000 | Kitsuno et al. |
| 6,083,810 A | 7/2000 | Obeng et al. |
| 6,121,161 A * | 9/2000 | Rossman et al. ............ 438/783 |
| 6,121,163 A * | 9/2000 | Gupta et al. ................. 438/788 |
| 6,136,211 A | 10/2000 | Qian et al. |
| 6,197,694 B1 | 3/2001 | Beinglass |
| 6,380,066 B1 * | 4/2002 | See et al. .................... 438/624 |
| 6,413,871 B2 * | 7/2002 | M'Saad et al. .............. 438/692 |
| 6,602,560 B2 * | 8/2003 | Cheng et al. ................ 427/579 |

FOREIGN PATENT DOCUMENTS

| | | |
|---|---|---|
| JP | 57209810 A | 12/1982 |
| JP | 59076919 A | 5/1984 |
| JP | 59078918 A | 5/1984 |
| JP | S60-43485 | 3/1985 |
| JP | 60043485 A | 3/1985 |
| JP | 61153277 A | 7/1986 |
| JP | 62076612 A | 4/1987 |
| JP | 63003414 A | 1/1988 |
| JP | 63003463 A | 1/1988 |
| JP | 01217956 A | 8/1989 |
| JP | 01268064 A | 10/1989 |
| JP | H 02-155225 | 6/1990 |
| JP | 02155225 A | 6/1990 |
| JP | H3-91239 | 4/1991 |
| JP | 03091239 A | 4/1991 |
| JP | H3-185817 | 8/1991 |
| JP | 03185817 A | 8/1991 |
| JP | H3-187215 | 8/1991 |
| JP | 03187215 A | 8/1991 |
| JP | 03292741 A | 12/1991 |
| JP | 04323834 A | 11/1992 |
| JP | 05021378 A | 1/1993 |
| JP | H5-62911 | 3/1993 |
| JP | 05062911 A | 3/1993 |
| JP | 07249618 A | 9/1995 |
| JP | 08242008 A | 9/1996 |

* cited by examiner

Primary Examiner—Bret Chen
(74) Attorney, Agent, or Firm—Duane Morris LLP

(57) ABSTRACT

A method for reducing contaminants in a processing chamber having an inner wall by seasoning the walls. The method comprising the following steps. A first USG film is formed over the processing chamber inner wall. An FSG film is formed over the first USG film. A second USG film is formed over the FSG film. A nitrogen-containing film is formed over the second USG film wherein the first USG film, the FSG film, the second USG film and the nitrogen-containing film comprise a UFUN season film.

24 Claims, 2 Drawing Sheets

METHOD TO SOLVE IMD-FSG PARTICLE AND INCREASE CP YIELD BY USING A NEW TOUGHER UFUN SEASON FILM

BACKGROUND OF THE INVENTION

Large particles falling from the reaction chamber's walls during FSG deposition results in tungsten (W) defects and reduces process capability (Cp) yield. These particles are FSG particles because of the outermost seasoning layer particles.

U.S. Pat. No. 6,020,035 to Gupta et al. describes an undoped silicate glass (USG) seasoning film and process.

U.S. Pat. No. 5,811,356 to Murugesh et al. describes a method and apparatus for reducing the concentration of mobile ion and metal contaminants in a processing chamber.

U.S. Pat. No. 5,983,906 to Zhao et al. describes systems, methods and apparatus for depositing titanium films at rates of up to 200 Å/minute on semiconductor substrates from a titanium tetrachloride source.

U.S. Pat. No. 6,121,161 to Rossman et al. describes a method and apparatus for controlling the introduction of contaminates into a deposition chamber that occur naturally within the chamber components.

U.S. Pat. No. 6,136,211 to Qian et al. describes a self-cleaning etch process whereby during etching of a substrate in an etching chamber, a thin non-homogeneous etch residue deposited on the surfaces of the walls and components of the etching chamber are simultaneously cleaned.

U.S. Pat. No. 5,705,080 to Leung et al. describes a plasma-inert cover and plasma cleaning process.

SUMMARY OF THE INVENTION

Accordingly, it is an object of an embodiment of the present invention to provide an improved method of seasoning inner processing chamber walls.

Other objects will appear hereinafter.

It has now been discovered that the above and other objects of the present invention may be accomplished in the following manner. Specifically, a first USG film is formed over the processing chamber inner wall. An FSG film is formed over the firs USG film. A second USG film is formed over the FSG film. A nitrogen-containing film is formed over the second USG film wherein the first USG film, the FSG film, the second USG film and the nitrogen-containing film comprise a UFUN season film.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Problem Known to the Inventors

The following problem is known to the inventors and is not to be considered to be prior art for the purposes of this patent.

When using a standard seasoning film for an FSG deposition processing chamber, heating of the chamber while using a plasma radical such as $Ar^+$ in the presence of $O^-$, causes contaminating particles to drop onto the wafer within the chamber due to striking of the plasma ions against the standard seasoning film.

Initial Structure

Figure 1:
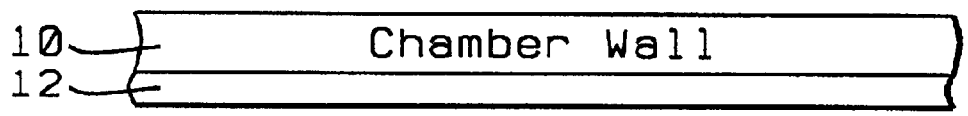
FIGS. 1 to 5 schematically illustrate a preferred embodiment of the present invention.

As shown in FIG. 1, inner chamber wall 10 is a portion of a wall, or a component, of a processing chamber that may be used for FSG deposition commonly used to form inter metal dielectric (IMD) layers over a wafer within the chamber. Preferably inner chamber wall 10 is first cleaned using, for example, preferably $NF_3$ as is known in the art to strip or remove substantially all traces of any previous seasoning film and any contaminants thereon or therein.

As shown in FIG. 1, a season-1 film 12 comprising undoped silicate glass (USG) is formed over the chamber wall 10 to a thickness of preferably from about 2400 to 2600 Å, more preferably from about 2450 to 2550 Å and most preferably about 2500 Å at the following parameters:

| Season-1 Film 12 | |
| --- | --- |
| about 20 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 0 sccm |

Formation of FSG Film 14

Figure 2:
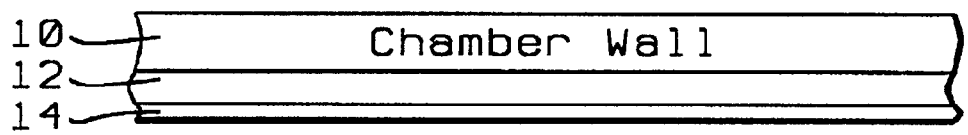

As shown in FIG. 2, fluorinated silica glass (FSG) film 14 is then formed over season-1 USG film 12 to a thickness of preferably from about 650 to 750 Å, more preferably from about 675 to 725 Å and most preferably about 700 Å at the following parameters:

| FSG Film 14 | |
| --- | --- |
| about 3 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 5 sccm |

Formation of Season-2 Film 16

Figure 3:
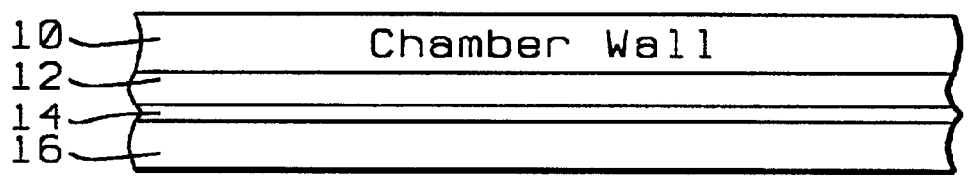

As shown in FIG. 3, a season-2 film 16 comprising undoped silicate glass (USG) is formed over FSG film 14 to a thickness of preferably from about 2700 to 2900 Å, more preferably from about 2750 to 2850 Å and most preferably about 2800 Å at the following parameters:

| Season-2 Film 16 | |
| --- | --- |
| about 25 seconds by time | Ar-side: about 95 sccm |
| turbo about 50 mT | Ar-top: about 15 sccm |
| about 3500 W RP, about 1W side-RF | $O_2$-side: about 270 sccm |
| 0 W OFF | $O_2$-top: about 20 sccm |
| | $SiH_4$-side: about 180 sccm |
| | $SiF_4$: 0 sccm |

Formation of Film 18—Key Step of the Invention

Figure 4:
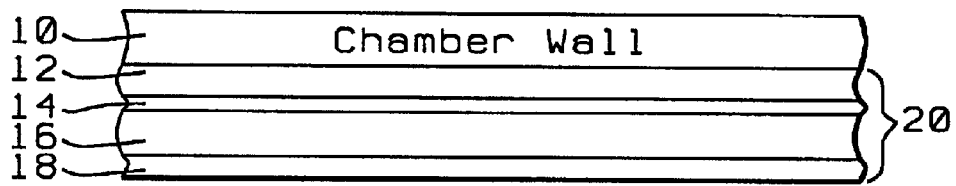

In a key step of the invention and as shown in FIG. 4, a nitrogen-containing film 18, preferably SiON or SiN and more preferably SiON, is then formed over Season-2 USG film 16 to a thickness of preferably from about 1300 to 1500 Å, more preferably from about 1350 to 1450 Å and most preferably about 1400 Å at the following parameters:

SiON Film 18 about X seconds by time (with X being dependent upon the thickness of the SiON film 18 being formed)

| | |
|---|---|
| turbo about 50 mT | Ar-side: about 95 sccm |
| about 3500 W RF, about 1W side-RF | Ar-top: about 15 sccm |
| 0 W OFF | $O_2$-side: about 270 sccm |
| | $O_2$-top: about 20 sccm |
| | $N_2$: about 400 sccm |

This completes formation of UFUN season film 20 comprising season-1 USG film 12/FSG film 14/season-2 USG film 16/SiON film 18.

Figure 5:
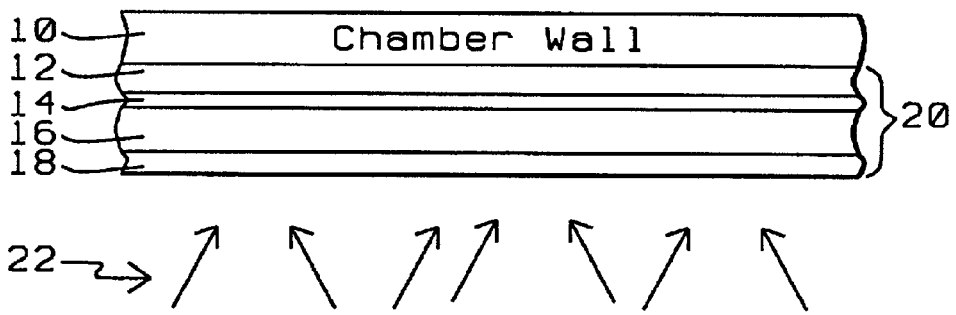

As shown in FIG. 5, the inventors have discovered that SiON film 18 is resistant to plasma ion bombardment 22, e.g. $Ar^+$ ions, during, for example, heating of the chamber of which chamber wall 10 is a part. That is a greatly reduced amount of contaminating particles drop from the tougher SiON film 18 due to plasma ion bombardment 22 during formation of, for example, an IMD-FSG layer over a wafer within the chamber.

For example the inventors have determined through KLA analyses:

| Condition | STD | | | Oxynitride Surface | | |
|---|---|---|---|---|---|---|
| Wafer ID | #20 | #22 | #24 | #21 | #23 | #25 |
| | FIRST ANALYSIS | | | | | |
| KLA Scan Total Data | 33 | 278 | 304 | 21 | 475 | 113 |
| FSG Particles | 1 | 0 | 2 | 1 | 0 | 0 |
| | SECOND ANALYSIS | | | | | |
| KLA Scan Total Data | 10 | 3 | 8 | 14 | 12 | 61 |
| FSG Particles | 1 | 1 | 1 | 1 | 0 | 0 |

This reduces defects in metal structures (for example tungsten (W) structures) over which the IMD-FSG layer is being formed and increases the process capability (Cp) about 3%. This is because the nitrogen-containing film/SiON film 18 with Si—N bonding formation at the surface has a stronger bonding energy than Si—bonding.

For example, the inventors have determined through experimentation using: a standard (STD) season film; an LDFSG film [while in deposition: side-RF=3100W; top-RF=720W; independent helium control (IHC)=4.7/7.9; and deposition time (D/T)=120 seconds]; and a UFUN film formed in accordance with the present invention [USG (20")/FSG (5")/USG (22")/SiON (10"); $N_2$=400 sccm; SiON (THK, center)=1200 Å; SiON (THK, edge)=2400 Å] with ΔF (STD)=0.05 and ΔF (UFUN)=0.08 that:

| Film | Cp Yield Mean |
|---|---|
| STD | 55.6 |
| LDFSG | 55.6 |
| UFUN | 59.7 |

In further examples using: a STD season film; and a UFUN film formed in accordance with the present invention [USG (20")/FSG (5")/USG (22")/SiON (5"); $N_2$=400 sccm; SiON (THK, center)=1200 Å; SiON (THK, edge)=2400 Å] with ΔF (STD)=0.05 and ΔF (UFUN)=0.08 that:

| Film | Cp Yield Mean |
|---|---|
| STD | 54.17 |
| UFUN | 58.24 | and;

| Film | Cp Yield Mean |
|---|---|
| STD | 59.62 |
| UFUN (SiON 4") | 63.25 |
| UFUN (SiON 7") | 62.56 |

Yet further for burn-in lots:

| Film | Cp Yield Mean |
|---|---|
| STD | 59.44 |
| UFUN (SiON 4") | 62.31 |
| STD | 69.85 |
| UFUN (SiON 4") | 74.00 |
| STD | 68.25 |
| UFUN (SiON 4") | 67.59 | wherein the related Bins short decrease from 12.9 to 11.7. Where Bins short is a particle related electrical analysis that indicates if the die is good or bad. The larger the Bins short within the wafer, the more bad dies there are.

The method of the present invention allows for three production runs within the chamber before cleaning/seasoning steps are required.

The inventors have found that Si—N bonding occurs at the surface of the UFUN film 20, i.e. the surface of nitrogen-containing film 18.

Further, the nitrogen-containing film 18 has a greater resistance to wet etching that the standard seasoning film and is therefore tougher. For example, the inventors have found:

| Condition | Surface Wet Etch (E/R) (Å/second) |
|---|---|
| Standard Season Film | 887 |
| UFUN Season Film 20 | 640 |
| Heated-up Standard Season Film | 665 |
| Heated-up UFUN Season Film 20 | 535 |

Advantages of the Present Invention

The advantages of the present invention include:
1. FSG particle contamination reduction; and
2. Cp yield improvement of about 3%.

While particular embodiments of the present invention have been illustrated and described, it is not intended to limit the invention, except as defined by the following claims.

We claim:

1. A method for reducing contaminants in a processing chamber having an inner wall by seasoning the processing chamber inner wall; the method comprising the steps of:

forming a first USG film over the processing chamber inner wall;

forming an FSG film over the first USG film;

forming a second USG film over the FSG film; and forming a nitrogen-containing film over the second USG film;

wherein the first USG film, the FSG film, the second USG film and the nitrogen-containing film comprise a UFUN season film.

2. The method of claim 1, wherein the first USG film is from about 2400 to 2600 Å thick, the FSG film is from about 650 to 750 Å thick, the second USG film is from about 2700 to 2900 Å thick and the nitrogen-containing film is from about 1300 to 1500 Å thick.

3. The method of claim 1, wherein the first USG film is from about 2450 to 2550 Å thick, the FSG film is from about 675 to 725 Å thick, the second USG film is from about 2750 to 2850 Å thick and the nitrogen-containing film is from about 1350 to 1450 Å thick.

4. The method of claim 1, wherein the first USG film is about 2500 Å thick, the FSG film is about 700 Å thick, the second USG film is about 2800 Å thick and the nitrogen-containing film is about 1400 Å thick.

5. The method of claim 1, wherein the nitrogen-containing layer is comprised of a material selected from the group consisting of SiON and SiN.

6. The method of claim 1, including the step of cleaning the chamber inner wall before forming the USG film over the chamber inner wall.

7. The method of claim 1, further including the step of performing three production runs before the seasoning of the processing chamber.

8. The method of claim 1, wherein:

the first USG film is formed using the parameters including:

| | |
|---|---|
| about 20 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 0 sccm; | the FSG film is formed using the parameters including:

| | |
|---|---|
| about 3 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 5 sccm; | the second USG film is formed using the parameters including:

| | |
|---|---|
| about 25 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 0 sccm; and | the nitrogen-containing film is formed using the parameters including:

| | |
|---|---|
| | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $N_2$: about 400 sccm. |

9. The method of claim 1, wherein the UFUN season film resists plasma ion bombardment.

10. A method for reducing contaminants in a processing chamber having an inner wall by seasoning the processing chamber inner wall; the method comprising the steps of:

forming a first USG film over the processing chamber inner wall;

forming an FSG film over the first USG film;

forming a second USG film over the FSG film; and forming an SiON film over the second USG film;

wherein the first USG film, the FSG film, the second USG film and the SiON film comprise a UFUN season film.

11. The method of claim 10, wherein the first USG film is from about 2400 to 2600 Å thick, the FSG film is from about 650 to 750 Å thick, the second USG film is from about 2700 to 2900 Å thick and the SiON film is from about 1300 to 1500 Å thick.

12. The method of claim 10, wherein the first USG film is from about 2450 to 2550 Å thick, the FSG film is from about 675 to 725 Å thick, the second USG film is from about 2750 to 2850 Å thick and the SiON film is from about 1350 to 1450 Å thick.

13. The method of claim 10, wherein the first USG film is about 2500 Å thick, the FSG film is about 700 Å thick, the second USG film is about 2800 Å thick and the SiON film is about 1400 Å thick.

14. The method of claim 10, including the step of cleaning the chamber inner wall before forming the USG film over the chamber inner wall.

15. The method of claim 10, further including the step of performing three production runs before the seasoning of the processing chamber.

16. The method of claim 10, wherein:

the first USG film is formed using the parameters including:

| | |
|---|---|
| about 20 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 0 sccm; | the FSG film is formed using the parameters including:

| | |
|---|---|
| about 3 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 5 sccm; | the second USG film is formed using the parameters including:

| | |
|---|---|
| about 25 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 0 sccm; and | the nitrogen-containing film is formed using the parameters including:

| | |
|---|---|
| | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $N_2$: about 400 sccm. |

17. The method of claim 10, wherein the UFUN season film resists plasma ion bombardment.

18. A method for reducing contaminants in a processing chamber having an inner wall by seasoning the processing chamber inner wall; the method comprising the steps of:
   forming a first USG film over the processing chamber inner wall; the first USG film being from about 2400 to 2600 Å thick;
   forming an FSG film over the first USG film; the FSG film being from about 650 to 750 Å thick,
   forming a second USG film over the FSG film; the second USG film being from about 2700 to 2900 Å thick; and
   forming an SiON film over the second USG film; the SiON film the SiON film is from about 1300 to 1500 Å thick from about 1300 to 1500 Å thick;
wherein the first USG film, the FSG film, the second USG film and the SiON film comprise a UFUN season film.

19. The method of claim 18, wherein the first USG film is from about 2450 to 2550 Å thick, the FSG film is from about 675 to 725 Å thick, the second USG film is from about 2750 to 2850 Å thick and the SiON film is from about 1350 to 1450 Å thick.

20. The method of claim 18, wherein the first USG film is about 2500 Å thick, the FSG film is about 700 Å thick, the second USG film is about 2800 Å thick and the SiON film is about 1400 Å thick.

21. The method of claim 18, including the step of cleaning the chamber inner wall before forming the USG film over the chamber inner wall.

22. The method of claim 18, further including the step of performing three production runs before the seasoning of the processing chamber.

23. The method of claim 18, wherein:
   the first USG film is formed using the parameters including:

| | |
|---|---|
| about 20 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 0 sccm; | the FSG film is formed using the parameters including:

| | |
|---|---|
| about 3 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 5 sccm; | the second USG film is formed using the parameters including:

| | |
|---|---|
| about 25 seconds by time | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $SiH_4$-side: about 180 sccm |
| | $SiF_4$: 0 sccm; and | the nitrogen-containing film is formed using the parameters including:

| | |
|---|---|
| | Ar-side: about 95 sccm |
| turbo about 50 mT | Ar-top: about 15 sccm |
| about 3500 W RF, about 1W side-RF | $O_2$-side: about 270 sccm |
| 0 W OFF | $O_2$-top: about 20 sccm |
| | $N_2$: about 400 sccm. |

24. The method of claim 18, wherein the UFUN season film resists plasma ion bombardment.

* * * * *

UNITED STATES PATENT AND TRADEMARK OFFICE
CERTIFICATE OF CORRECTION

PATENT NO. : 6,815,007 B1
DATED : November 9, 2004
INVENTOR(S) : Ming-Hwa Yoo et al.

It is certified that error appears in the above-identified patent and that said Letters Patent is hereby corrected as shown below:

Column 2,
Line 59, please delete "RP" and insert -- RF --.

Signed and Sealed this

Twenty-sixth Day of April, 2005

JON W. DUDAS
*Director of the United States Patent and Trademark Office*